US008105889B2

(12) United States Patent  
Smith et al.

(10) Patent No.: US 8,105,889 B2
(45) Date of Patent: Jan. 31, 2012

(54) METHODS OF FABRICATING TRANSISTORS INCLUDING SELF-ALIGNED GATE ELECTRODES AND SOURCE/DRAIN REGIONS

(75) Inventors: R. Peter Smith, Carrboro, NC (US); Scott T. Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 81 days.

(21) Appl. No.: 12/509,855

(22) Filed: Jul. 27, 2009

(65) Prior Publication Data

US 2011/0018040 A1 Jan. 27, 2011

(51) Int. Cl.
H01L 21/338 (2006.01)

(52) U.S. Cl. ............... 438/181; 438/182; 257/E21.341

(58) Field of Classification Search .............. 438/180, 438/181, 182; 257/E21.34, E21.341
See application file for complete search history.

(56) References Cited

U.S. PATENT DOCUMENTS

| 4,929,567 | A | 5/1990 | Park et al. |
| 4,946,547 | A | 8/1990 | Palmour et al. |
| 5,192,987 | A | 3/1993 | Khan et al. |
| 5,200,022 | A | 4/1993 | Kong et al. |
| 5,210,051 | A | 5/1993 | Carter, Jr. |
| 5,292,501 | A | 3/1994 | Degenhardt et al. |
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 5,891,783 | A * | 4/1999 | Lin et al. ............... 438/302 |
| 6,218,680 | B1 | 4/2001 | Carter, Jr. et al. |
| 6,316,793 | B1 | 11/2001 | Sheppard et al. |
| 6,730,586 | B2 * | 5/2004 | Endoh ...................... 438/574 |
| 6,849,882 | B2 | 2/2005 | Chavarkar et al. |
| 6,982,204 | B2 | 1/2006 | Saxler et al. |
| 7,030,428 | B2 | 4/2006 | Saxler |
| 7,045,404 | B2 | 5/2006 | Sheppard et al. |
| 7,419,892 | B2 | 9/2008 | Sheppard et al. |
| 2002/0066908 | A1 | 6/2002 | Smith |
| 2002/0167023 | A1 | 11/2002 | Chavarkar et al. |
| 2003/0102482 | A1 | 6/2003 | Saxler |
| 2005/0170574 | A1 | 8/2005 | Sheppard et al. |
| 2007/0164321 | A1 | 7/2007 | Sheppard et al. |
| 2007/0164322 | A1 | 7/2007 | Smith et al. |
| 2007/0205433 | A1 | 9/2007 | Parikh et al. |
| 2007/0269968 | A1 | 11/2007 | Saxler et al. |

OTHER PUBLICATIONS

Yu et al., "Schottky barrier engineering in III-V nitrides via the piezoelectric effect", Applied Physics Letters, vol. 73:13, pp. 1880-1882 (Sep. 28, 1998).
Invitation to Pay Additional Fees and, Where Applicable, Protest Fee; Corresponding to International Application No. PCT/US2010/041202; Mail date: Oct. 18, 2010; 8 pages. Kameche et al., "High-Temperature Distortion and Power-Handling Properties of GaAs-, 4HSiC-, GaN- MESFET's Switches", Electrotechnical Conference, IEEE MELECON May 16-19, 2006, Benalmadena (Malaga), Spain; pp. 169-172; XP-010927716.
Yamasaki et al., "N+Self-Aligned MESFET for GaAs LSIs", Japanese Journal of Applied Physics, vol. 22 (1983) Supplement 22-1, pp. 381-384, XP-001491212.
International Search Report and Written Opinion of the International Searching Authority corresponding to International Application No. PCT/US2010/041202; Date of Mailing: Mar. 29, 2011; 18 pages.

* cited by examiner

Primary Examiner — Stephen W Smoot
(74) Attorney, Agent, or Firm — Myers Bigel Sibley & Sajovec

(57) ABSTRACT

Methods of forming Group III-nitride transistor device include forming a protective layer on a Group III-nitride semiconductor layer, forming a via hole through the protective layer to expose a portion of the Group III-nitride semiconductor layer, and forming a masking gate on the protective layer. The masking gate includes an upper portion having a width that is larger than a width of the via hole and having a lower portion extending into the via hole. The methods further include implanting source/drain regions in the Group III-nitride semiconductor layer using the masking gate as an implant mask.

18 Claims, 7 Drawing Sheets

METHODS OF FABRICATING TRANSISTORS INCLUDING SELF-ALIGNED GATE ELECTRODES AND SOURCE/DRAIN REGIONS

FIELD OF THE INVENTION

The present invention relates to semiconductor devices, and, more particularly, to methods of fabricating transistors and related devices.

BACKGROUND

Materials such as silicon (Si) and gallium arsenide (GaAs) have found wide application in semiconductor devices for lower power and, in the case of Si, lower frequency applications. However, these more familiar semiconductor materials may not be well suited for higher power and/or high frequency applications, for example, due to their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, may have higher electric field breakdown strengths and higher electron saturation velocities as compared to gallium arsenide and/or silicon.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped ("unintentionally doped") smaller bandgap material, and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and relatively high carrier mobility can give the HEMT a relatively large transconductance, and may provide a performance advantage over metal-semiconductor field effect transistors (MESFETs) for high-frequency applications.

High electron mobility transistors fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

HEMTs in the GaN/AlGaN system have already been demonstrated. For example, U.S. Pat. Nos. 5,192,987 and 5,296,395 describe AlGaN/GaN HEMT structures and methods of manufacture. In addition, U.S. Pat. No. 6,316,793, to Sheppard et al., which is commonly assigned and incorporated by reference herein, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure. Moreover, U.S. Patent Application Publication No. US2005/0170574 to Sheppard et al., which is also commonly assigned and incorporated by reference herein, describes a HEMT device including a protective layer and/or a low damage recess fabrication technique which may reduce damage to the semiconductor in the gate region of the transistor that may occur during an anneal of ohmic contacts of the device.

SUMMARY

Methods of forming Group III-nitride transistor device according to some embodiments include forming a protective layer on a Group III-nitride semiconductor layer, forming a via hole through the protective layer to expose a portion of the Group III-nitride semiconductor layer, and forming a masking gate on the protective layer. The masking gate includes an upper portion having a width that is larger than a width of the via hole and having a lower portion extending into the via hole. A lateral distance from an outer edge of the upper portion of the masking gate to an edge of the via hole may be less than about 300 nm. The methods further include implanting source/drain regions in the Group III-nitride semiconductor layer using the masking gate as an implant mask.

Some embodiments include removing the masking gate, and depositing a conductive material in the via hole.

The protective layer may include a first protective layer, and the methods may further include forming a second protective layer on the first protective layer and on the masking gate after implanting the source/drain regions, and etching the second protective layer to expose the masking gate. Removing the masking gate may include removing the masking gate after etching the second protective layer, and forming an aperture in the second protective layer.

The methods may further include depositing a conductive material in the via hole and in the aperture in the second protective layer after removing the masking gate, and patterning the conductive material to form a gate contact. A portion of the gate contact may extend laterally across the protective layer. A second portion of the gate contact may extend laterally across the second protective layer beyond the aperture in the second protective layer.

The methods may include forming a metal overlayer on the gate contact.

The lateral distance from the outer edge of the masking gate to the edge of the via hole may be about 100 nm to about 300 nm in some embodiments. In some embodiments, the via hole has a width of about 100 nm.

Forming the masking gate may include forming a first resist layer on the protective layer, forming a second resist layer on the first resist layer, wherein the first resist layer is between the second resist layer and the protective layer, and patterning the first resist layer and the second resist layer to respectively form a first aperture in the first resist layer and a second aperture in the second resist layer. The first aperture is between the second aperture and the protective layer and the first aperture has a greater width than the second aperture. Forming the via hole may include etching the protective layer using the second resist layer as an etch mask.

Forming the masking gate may include depositing a masking material in the first aperture and the via hole. The masking material may have an etch selectivity relative to the protective layer and the Group III-nitride layer.

Depositing a masking material in the first aperture and the via hole may include depositing aluminum nitride in the first aperture and the via hole.

The first resist and the second resist may include e-beam resists having different developer sensitivities, and patterning the first resist layer and the second resist layer include exposing the first resist layer and the second resist layer to an e-beam and developing the first resist layer and the second resist layer using different developers.

The methods may further include annealing the implanted source/drain regions with the masking gate intact. The masking gate may be removed after annealing the implanted source/drain regions.

The methods may further include removing the protective layer after annealing the source/drain regions and before removing the masking gate, and forming a second protective layer on the Group III-nitride layer and the masking gate before removing the masking gate.

The methods may further include expanding the width of the second aperture before forming the masking gate. The width of the masking gate may be defined by the expanded width of the second aperture. Expanding the width of the second aperture may include ashing the second resist layer.

The masking gate may include a refractory metal, aluminum nitride, polysilicon and/or a metal silicide.

The protective layer may include silicon nitride.

A Group III-nitride based semiconductor device according to some embodiments includes a Group III-nitride semiconductor layer, with spaced apart source and drain regions in the Group III-nitride semiconductor layer and a protective layer on the Group III-nitride semiconductor layer. The protective layer includes a via hole therethrough exposing a portion of the Group III-nitride semiconductor layer. A gate contact is in the via hole. An edge of at least one of the source and drain regions is positioned within about 300 nm or less from an edge of the gate contact. In some embodiments, the edge of at least one of the source and drain regions is positioned within about 100 nm to 300 nm from an edge of the gate contact.

The device may further include a second protective layer on the protective layer, the second protective layer including an aperture therethrough aligned with the via hole. The gate contact may be in the aperture and may extend laterally across a portion of the second protective layer.

DETAILED DESCRIPTION OF EMBODIMENTS

Figure 1A:
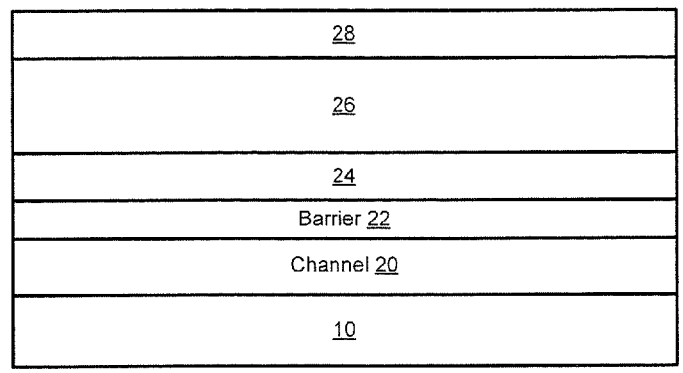
FIGS. 1A to 1I are cross-sectional views illustrating intermediate fabrication steps in operations for fabricating transistor devices according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower" encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected.

Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Embodiments of the present invention may be particularly well suited for use in nitride-based HEMTs, such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds may all have empirical formulas in which one mole of nitrogen is combined with a total of one mole of the Group III elements. Accordingly, formulas such as $Al_xGa_{1-x}N$, where $0 \leq x \leq 1$, may be used to describe these compounds.

Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME", United States Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", and U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," the disclosures of which are hereby incorporated herein by reference in their entirety.

Some embodiments of the present invention may arise from a realization that, for devices operating at relatively high frequencies (for example, above the X-band frequency range), and particularly for millimeter wave radio frequency (RF) devices, it may be desirable for the source/drain regions of a transistor to be very close to the gate metal. However, conventional lithographic techniques may be unable to reliably place the source/drain implants within an desired distance from the gate metal. Accordingly, some embodiments provide self-aligned methods of forming the gate metal and the source/drain implants that may be capable of reliably forming the source/drain implants very close to the gate metal, for example, within about 100 to 300 nm of the gate metal.

FIGS. 1A to 1I are cross-sectional views illustrating exemplary intermediate fabrication steps in methods for fabricating transistor devices according to some embodiments of the present invention. Referring now to FIG. 1A, a substrate 10 is provided on which a transistor device may be formed. A channel layer 20 is formed on the substrate 10, and a barrier layer 22 is formed on the channel layer 20.

The substrate 10 may be a semi-insulating silicon carbide (SiC) substrate that may be, for example, the 4H polytype of silicon carbide. Other silicon carbide candidate polytypes may include the 3C, 6H, and 15R polytypes. The term "semi-insulating" is used descriptively herein, rather than in an absolute sense. In some embodiments of the present invention, the silicon carbide bulk crystal may have a resistivity equal to or higher than about $1 \times 10^5$ Ω-cm at room temperature.

Silicon carbide has a much closer crystal lattice match to Group III nitrides (which may be employed in the channel layer 20 and/or the barrier layer 22) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance. Exemplary SiC substrates that may be used in some embodiments of the present invention are manufactured by, for example, Cree, Inc., of Durham, N.C., the assignee of the present invention, and methods for producing such substrates are described, for example, in U.S. Pat. Nos. Re. 34,861; 4,946,547; 5,200,022; and 6,218,680, the disclosures of which are incorporated by reference herein in their entireties. Similarly, techniques for epitaxial growth of Group III nitrides have been described in, for example, U.S. Pat. Nos. 5,210,051; 5,393,993; 5,523,589; and 5,292,501, the disclosures of which are also incorporated by reference herein in their entireties.

It is to be understood that, although silicon carbide may be employed as a substrate, embodiments of the present invention may utilize any suitable substrate for the substrate 10, such as sapphire ($Al_2O_3$), aluminum nitride (AlN), aluminum gallium nitride (AlGaN), gallium nitride (GaN), silicon (Si), gallium arsenide (GaAs), $Lu_2O_3/Ga_2O_3$ (LGO), zinc oxide (ZnO), $Lu_2O_3/Al_2O_3$ (LAO), indium phosphide (InP), and the like. It will be further understood that the presence of a growth substrate is optional, and the epitaxial layers of the device, including the channel layer 20 and the barrier layer 22 can be removed from a growth substrate and mounted on a carrier substrate, submount, package body or other support that may provide more suitable mechanical, thermal and/or electrical characteristics. Accordingly, in subsequent figures, the substrate is not illustrated.

Optional buffer, nucleation and/or transition layers (not shown) may also be provided on the substrate 10. For example, an AlN buffer layer may be provided to provide an appropriate crystal structure transition between a silicon carbide substrate and the remainder of the device. Additionally, strain balancing transition layer(s) may also be provided as described, for example, in commonly assigned United States Patent Publication 2003/0102482A1, filed Jul. 19, 2002 and published Jun. 5, 2003, and entitled "STRAIN BALANCED NITRIDE HETEROJUNCTION TRANSISTORS AND METHODS OF FABRICATING STRAIN BALANCED NITRIDE HETEROJUNCTION TRANSISTORS", and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated by reference herein as if set forth fully herein.

Still referring to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer 20 and/or buffer, nucleation, and/or transition layers may be deposited by metal-organic chemical vapor deposition (MOCVD) or by other techniques known to those of skill in the art, such as molecular beam epitaxy (MBE) and/or hydride vapor phase epitaxy (HVPE). In some embodiments of the present invention, the channel layer 20 may be a Group III-nitride layer, such as GaN. The channel layer 20 may also include other Group III-nitride layers, such as indium gallium nitride (InGaN), aluminum indium gallium nitride (AlInGaN), or the like. The channel layer 20 may be undoped (i.e., "unintentionally doped"), and may be grown to a thickness of greater than about 20 Å. The channel layer 20 may also be a multi-layer structure, such as a superlattice or combinations of GaN, AlGaN, or the like.

As further shown in FIG. 1A, a barrier layer 22 is provided on the channel layer 20. For example, the barrier layer 22 may be epitaxially formed on the channel layer 20. The barrier layer 22 may be a Group III-nitride layer, such as $Al_xGa_{1-x}N$ (where 0<x<1). The barrier layer 22 may also include other Group III-nitride layers, such as AlInGaN, AlN, and/or combinations of layers thereof. The barrier layer 22 may, for example, be from about 0.1 nm to about 100 nm thick, but may not be so thick as to cause cracking or substantial defect formation therein. In certain embodiments of the present invention, the barrier layer 22 may be a highly-doped n-type layer. For example, the barrier layer 22 may be doped to a concentration of less than about $10^{19}$ $cm^{-3}$.

Some embodiments of the present invention may be applicable for use in high electron mobility transistors (HEMTs). More particularly, the channel layer 20 and the barrier layer 22 may be formed of materials having different bandgaps, such that an interface between the channel layer and the barrier layer defines a heterojunction. For example, the channel layer 20 may have a bandgap that is less than the bandgap of the barrier layer 22. As such, the energy of the conduction band edge of the channel layer 20 may be less than the energy of the conduction band edge of the barrier layer 22 at the junction between the channel 20 and barrier 22 layers, and the channel layer 20 may have a greater electron affinity than the barrier layer 22. For example, where both the channel layer 20 and the barrier layer 22 are formed of Group III-nitride layers, the channel layer 20 may be a GaN layer, and the barrier layer 22 may be a AlGaN layer.

Examples of layers according to certain embodiments of the present invention are described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 may have a thickness, Al composition, and/or doping sufficient to induce a significant carrier concentration at the interface between the channel layer 20 and the barrier layer 22 through polarization effects when the barrier layer 22 is buried under ohmic contact metal. Also, the barrier layer 22 may be thick enough to reduce or minimize scattering of electrons in the channel due to ionized impurities deposited at the interface between the barrier layer 22 and a subsequently formed protective layer.

In addition, in other embodiments of the present invention, the channel layer 20 and the barrier layer 22 may have different lattice constants. For example, the barrier layer 22 may be a relatively thin layer having a smaller lattice constant than the channel layer 20, such that the barrier layer 22 "stretches" at the interface between the two. Accordingly, a pseudomorphic HEMT (pHEMT) device may be provided.

As further illustrated in FIG. 1A, a protective layer 24 is formed on the barrier layer 22. The protective layer 24 may be dielectric material, such as silicon nitride ($Si_xN_y$), aluminum nitride (AlN), silicon dioxide (SiO2), and/or other suitable protective material. Other materials may also be utilized for the protective layer 24. For example, the protective layer 24 may also include magnesium oxide, scandium oxide, aluminum oxide and/or aluminum oxynitride. Furthermore, the protective layer 24 may be a single layer or may include multiple layers of uniform and/or non-uniform composition.

The protective layer 24 may be blanket formed on the barrier layer 22. For example, the protective layer 24 may be a silicon nitride (SiN) layer formed by high quality sputtering and/or plasma-enhanced chemical vapor deposition (PECVD). The protective layer 24 may have a thickness of about 30 mn, however, other thickness layers may also be utilized. For example, the protective layer may be sufficiently thick so as to protect the underlying layer during a subsequent anneal of ohmic contacts. Layers as thin as two or three monolayers may be sufficient for such purposes. However, in general, the protective layer 24 may have a thickness of from about 10 nm to about 500 nm. Also, a high quality SiN protective layer may be grown in-situ with the MOCVD growth of the group III nitride layers.

In particular embodiments of the present invention, the protective layer 24 may be SiN. The SiN protective layer may be formed by PVD and/or CVD and may be non-stoichiometric in compressive or tensile strain. For example, the SiN protective layer may have a stress of between about −100 MPa and about 100 MPa. In certain embodiments of the present invention, the SiN protective layer may have an index of refraction at a 633 mn wavelength of from about 1.6 to about 2.2. In particular embodiments, the index of refraction of the SiN protective layer may be 1.98±0.05.

Still referring to FIG. 1A, a first resist layer 26 and a second resist layer 28 are formed on the protective layer 24. In some embodiments, the first resist layer 26 and the second resist layer 28 may include positive e-beam resists that have different developer sensitivities. In some other embodiments, the first resist layer 26 and the second resist layer 28 may include different photoresists. For example, in some embodiments, the first resist layer 26 may be a lift off resist (LOR) based on polymethylglutarimide (PMGI) such as LOR from Micro-Chem, while the second resist layer 28 may include a standard novolac-based photoresist such as MEGAPOSIT™ SPR™

660 from Rohm & Haas. The first resist layer 26 may have a thickness of at least about 0.2 µm to about 0.5 µm.

Figure 1B:
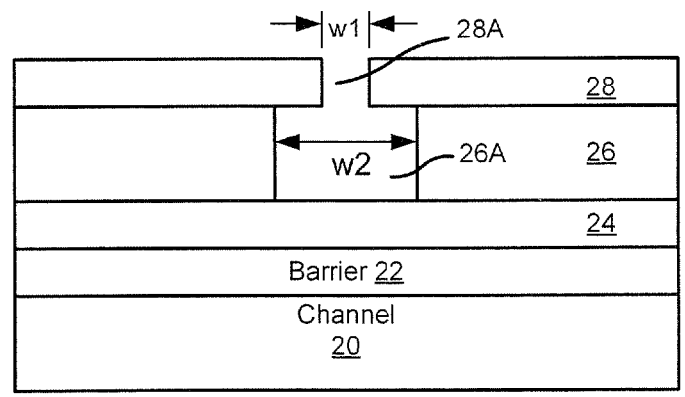

Referring to FIG. 1B, the second resist layer 28 is exposed using photolithography or e-beam lithography and developed to form an aperture 28A therein having a width w1. The width w1 may be in the range of about 60 nm to about 600 nm. In some embodiments, the width w1 may be about 100 nm.

An aperture 26A is formed in the first resist layer 26 and aligned with the aperture 28A in the second resist layer 28. The aperture 26A is formed to have a second width w2 that is greater than the width w1 of the aperture 28A.

In some embodiments, the aperture 26A may be formed in the first resist layer at the same time as the aperture 28A in the second resist layer 28. For example, the first resist layer 26 and the second resist layer 28 may include different resist materials that have different developer sensitivities. Both the first resist layer 26 and the second resist layer 28 may be exposed and developed at the same time. However, due to their differing developer sensitivities, more of the first resist layer 26 than the second resist layer 28 may develop away, forming a larger aperture 26A in the first resist layer 26 than in the second resist layer 28.

In some other embodiments, after a single exposure, the aperture 28A in the second resist layer 28 may be developed in a first step using a first developer, while the aperture 26A in the first resist layer 26 may be developed in a separate step using a second developer.

Figure 1C:
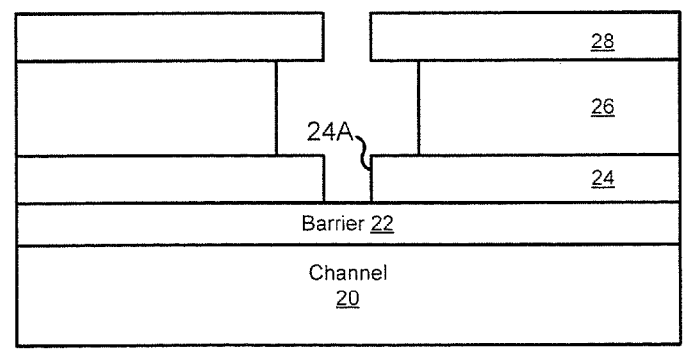

Referring to FIG. 1C, a via hole 24A may be etched into the protective layer 24, for example, by dry etching using suitable etch chemistry. For example, a SiN protective layer 24 may be etched using a reactive ion etch (RIE) and/or an inductively coupled plasma (ICP) etch with a fluoride based chemistry, such as $SF_6$.

In some embodiments, the via hole 24A may be formed using a low-damage etch with respect to the barrier layer 22. Examples of low damage etch techniques may include etching techniques other than reactive ion etching, such as inductively coupled plasma or electron cyclotron resonance (ECR) or downstream plasma etching with no DC component to the plasma. For example, for a $SiO_2$ barrier layer, a wet etch with buffered hydrofluoric acid may be used. A selective etch of SiN and/or $SiO_2$ to an etch stop layer, such as ITO, SCO, MgO or the like, followed by a low damage removal of the etch stop layer may also be performed. For a SiN barrier layer, $SiO_2$ may be used as an etch stop layer. In such embodiments, the protective layer 24 may include the SiN, AlN, and/or $SiO_2$ layers, as well as the etch stop layer.

The second resist layer 28 may act as the etch mask for etching the via hole 24A. Accordingly, the via hole 24A in the protective layer 24 may have a width that is substantially the same as the width w1 of the aperture 28A in the second resist layer 28.

Figure 1D:
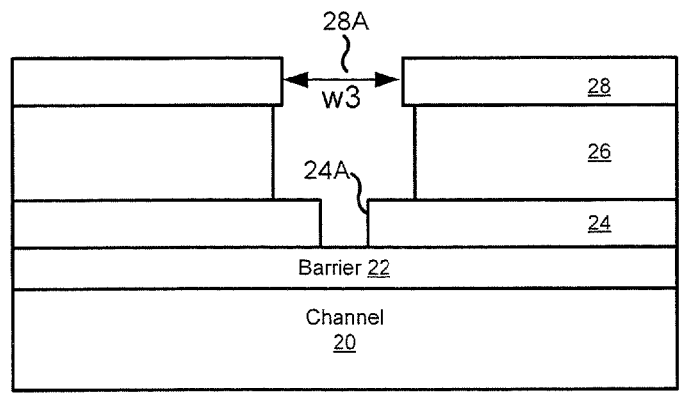

Next, referring to FIG. 1D, the width of the aperture 28A in the second resist layer 28 is expanded to have a width w3. In some embodiments, the width of the aperture 28A in the second resist layer 28 may be expanded with a high level of precision by ashing the second resist layer 28. In particular, the second resist layer 28 may be ashed using an oxygen plasma and/or by hard baking the device, for example, at a temperature above 100° C. but below 150° C. The amount of widening may be controlled by controlling the time and/or temperature of the ashing process.

In some embodiments, the width w3 may be in the range of about 200 nm to 600 nm wider than the original width w1 of the aperture 28A, and accordingly may be about 200 nm to 600 nm wider than the via hole 24A.

Figure 1E:
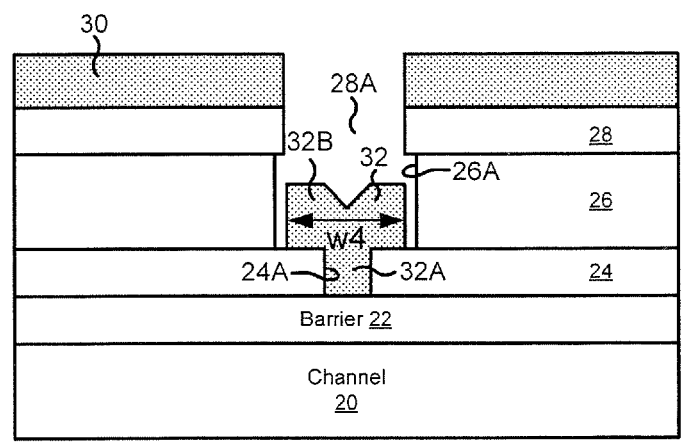

Referring to FIG. 1E, a masking gate material 30 is deposited in the via hole 24A and the aperture 26A in the first resist layer 26 to form a masking gate 32 including a lower portion 32A extending into the via hole 24A and an upper portion 32B in the aperture 26A and extending laterally across the protective layer 24. As used herein, the term "laterally" refers to a direction that is substantially parallel with respect to a direction of current flow under the gate. The masking gate material 30 may be deposited, for example, by sputtering and/or evaporation. The masking gate material 30 may in some embodiments include an insulating material, such as silicon dioxide and/or aluminum nitride. However, in other embodiments, the masking gate material may include a material such as a refractory metal, polysilicon and/or a metal silicide.

In general, the masking gate material 30 may include a material that has an etch selectivity relative to the material of the protective layer 24 and the material of the barrier layer 22. Furthermore, the masking gate material 30 may be formed to have a thickness that is sufficient to allow the masking gate 32 to act as an implant mask in a subsequent process step. Finally, in some embodiments, the masking gate material 30 may include a material that is able to withstand high anneal temperatures during a subsequent source/drain activation anneal and to protect the surface of the barrier layer 22 during such anneal.

The masking gate 32 has a width w4 that is defined by the width w3 of the expanded second aperture 28A. Accordingly, the width w4 may be in the range of about 200 mn to 600 nm wider than the width w2 of the via hole 24A. An edge of the masking gate 32 may therefore extend laterally past an edge of the via hole 24A by a distance in the range of about 100 nm to 300 nm.

Figure 1F:
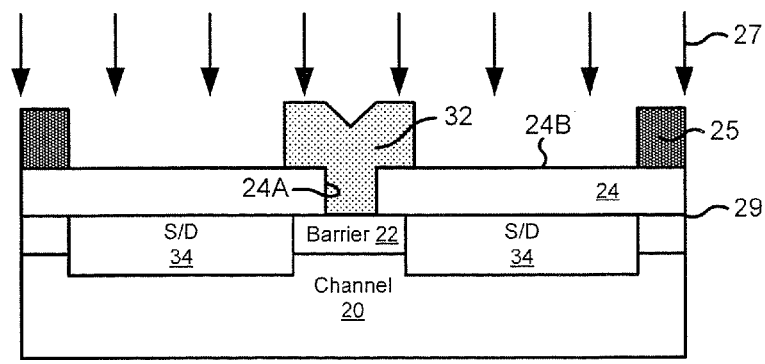

Referring to FIG. 1F, the first and second resist layers 24, 26 are removed, thereby removing excess amounts of the masking gate material 30 formed thereon and leaving the masking gate 32 in place on the protective layer 24 and the barrier layer 22. Referring still to FIG. 1F, a mask 25 is formed on the protective layer 24. The mask 25 may include photoresist or any other suitable mask material such as SiN and/or $SiO_2$. For example, when the protective layer comprises SiN, the mask 25 may include an oxide such as $SiO_2$, and vice-versa. The mask may have a thickness selected to block implanted ions.

Source/drain regions 34 are then implanted through the protective layer 24 and into the channel layer 20 and the barrier layer 22. In the source/drain implantation, the masking gate 32 acts as an implant mask to define the lateral positioning of the source/drain regions 34 relative to an edge of the gate. Accordingly, the initial position of the source/drain regions 34 before the activation anneal may be in the range of about 100 nm to 300 mn from an edge of the via hole 24A where the masking gate 32 contacts the barrier layer 22.

In particular, a window is opened in the mask 25 to expose surface portions 24B of the protective layer 24 as well as the masking gate 32, and impurity ions 27 are implanted through the windows into the protective layer 24 such that at least a portion of the implanted ions come to rest within the barrier layer 22. In addition, some of the implanted ions may come to rest within the channel layer 20. In some cases, the implanted ions form a concentration profile having a peak near the interface 29 between the protective layer 24 and the barrier layer 22. However, the implant peak may be placed away from (i.e. above or below) the interface 29 between the protective layer 24 and the barrier layer 22. Accordingly, as shown in FIG. 1F, an implanted region 31 may be formed partially within the barrier layer 22 and/or the channel layer 20.

The implant conditions may be selected to provide an implanted region 31 having a peak dopant concentration of $1\times10^{18}$ cm$^{-3}$ or greater. For example, in some embodiments, the dose and energy of the implants may be selected to provide a peak dopant concentration of about $5\times10^{19}$ cm$^{-3}$. The implant process may include multiple implant steps to provide a net profile of implanted dopants. For example, the implant process may include a first implant step performed under a first set of implant conditions and a subsequent implant step performed under a second set of implant conditions. More than two implant steps may be performed.

In some embodiments, the implants may be performed at room temperature. The implant energies and dose may be selected to provide an implant profile that achieves a desired sheet resistivity and/or permits fabrication of low resistivity ohmic contacts to the barrier layer 22 as provided below. In order to form n-type implanted regions in a nitride-based layer, the implanted ions may include silicon, sulfur and/or oxygen ions.

After formation of the implanted source/drain regions 34, the implants may be activated by an activation anneal. The mask 25 may be removed prior to the implant activation anneal, for example by means of a photoresist strip and/or an etch process. However, the activation anneal may be performed with the protective layer 24 and the masking gate 32 in place. In particular, the protective layer 24 and the masking gate 32 may protect the surface of the barrier layer 22 during the anneal. It will be appreciated that the lateral positioning of the source/drain regions 34 may move slightly as a result of diffusion during the activation anneal. However, the lateral distance from the edge of the source/drain regions 34 to the edge of the via hole 24A may nevertheless still fall within the range of about 100 nm to about 300 nm. Moreover, the amount by which the lateral positioning of the source/drain regions 34 moves as a result of diffusion during the activation anneal may be predictable based on the anneal conditions.

The activation anneal may be performed in an inert atmosphere including, for example, N$_2$ and/or Ar. When the protective layer 24 includes SiN, the anneal atmosphere may include a partial pressure of NH$_3$ in the range of about 0.1 mbar to 1000 mbar. More particularly, the NH$_3$ may have a pressure in the range of of about 10 mbar to 100 mbar. In particular, the NH$_3$ may have a pressure of about 90 mbar. The NH$_3$ may help to reduce decomposition of the SiN protective layer 24. The activation anneal may be performed at a temperature sufficient to activate the implanted dopant ions but less than a temperature at which the underlying semiconductor layer, i.e. the barrier layer 22, deteriorates. The presence of the protective layer 24 during the high temperature process steps may inhibit damage to the underlying epitaxial layers, including barrier layer 22, that may otherwise result from high temperature annealing. For example, where the barrier layer 22 includes AlGaN, the activation anneal may be performed at a temperature greater than 1000° C.

In some embodiments, SiH$_4$ may be provided during the implant anneal along with NH$_3$, in which case SiN may be deposited on the protective layer during the anneal.

In some embodiments, the activation anneal may be performed at a temperature of about 1000° C. to about 1300° C., and in some embodiments at an anneal temperature of about 1100° C. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes.

Figure 1G:
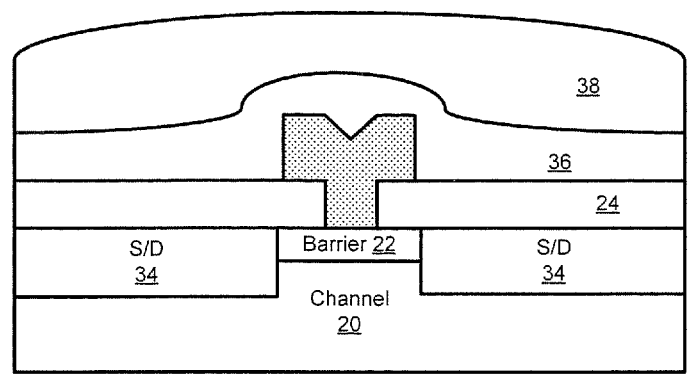

Referring to FIG. 1G, following the activation anneal, a second protective layer 36 may be formed on the protective layer 24. The second protective layer 36 may include a dielectric material, such as SiO$_2$ and/or SiN. The second protective layer may be formed, for example, by sputtering, so that it forms a conformal layer on the masking gate 32. The second protective layer 36 may have a thickness that is less than a height of the masking gate 32 over the protective layer 24. In some embodiments, the second protective layer may have a thickness that is less than about 0.5 µm.

Still referring to FIG. 1G, an optional layer of resist 38 may be formed on the second protective layer 36.

Figure 1H:
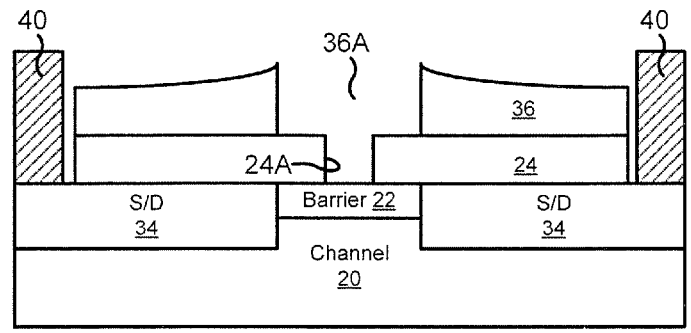

Referring to FIG. 1H, the layer of resist 38 and the second protective layer 36 may be planarized and/or etched to expose the masking gate 32. For example, in some embodiments, the layer of resist 38 and the second protective layer 36 may be planarized using a chemical mechanical polish. In some embodiments, the layer of resist 38 may be etched by ashing. If the second protective layer 36 is a silicon nitride layer, it may be etched back by dry etching with a fluourine based chemistry, such as CF$_4$. In some embodiments, a mixture of both oxygen and CF$_4$ may be used to etch back both the resist 38 and the second protective layer 36.

After etching back the second protective layer to expose the masking gate 32, the masking gate 32 may be removed, for example by etching. In embodiments in which the masking gate 32 includes AlN, the masking gate 32 can be removed by etching with an undiluted TMAH (tetra methyl ammonium hydroxide) based developer. Such an etchant preferentially etches sputtered and/or evaporated AlN without substantially affecting the first or second protective layers 24, 36, or the AlGaN barrier layer 22. Moreover, TMAH may not etch epitaxially grown AlN, which may be used as a barrier layer and/or which, may be present as a capping layer on the AlGaN barrier layer 22. Accordingly, the masking gate 32 is removed from the via hole 24A in the first protective layer. An opening 36A is thereby formed in the second protective layer 36.

When the masking gate 32 includes polysilicon, an etchant such as ethylene diamine-pyrocatechol (EDP) may be used to preferentially remove the masking gate 32.

As further illustrated in FIG. 1H, source/drain contacts 40 may be formed on the source/drain regions 34, for example, after removal of the masking gate 32.

In some embodiments, the first and second protective layers 24, 36 are patterned to expose portions of the source/drain regions 34, and first and second ohmic contacts 40 are formed on the source/drain regions 34. For example, windows may be etched into the first and second protective layers 24, 36 to expose the underlying source/drain regions 34. The windows may be etched utilizing a patterned mask and a low-damage etch as described above with respect to the source/drain regions 34.

Still referring to FIG. 1H, using a subsequent photolithography step and evaporation, ohmic metal is formed on the exposed portions of the source/drain regions 34. The ohmic metal may be patterned so as to be smaller than the window in the protective layer 24, and the ohmic metal is annealed to provide the first and second ohmic contacts 40. As such, the edges of the source/drain ohmic contacts 40 may be spaced apart from the adjacent protective layers 24, 36.

Suitable ohmic metals may include refractory metals, such as titanium (Ti), tungsten (W), titanium tungsten (TiW), silicon (Si), titanium tungsten nitride (TiWN), tungsten silicide (WSi), rhenium (Re), Niobium (Nb), nickel (Ni), gold (Au), aluminum (Al), tantalum (Ta), molybdenum (Mo), nickel silicide (NiSi), titanium silicide (TiSi), titanium nitride (TiN), tungsten silicon nitride (WSiN), and/or platinum (Pt) and the like.

The anneal may be a relatively high temperature anneal. For example, the anneal may be performed at a temperature of greater than about 900° C. By using such an ohmic contact anneal, the resistance of the ohmic contact regions 30 may be reduced from a relatively high resistance to, for example, less than about 1 Ω-mm. Thus, as used herein, the term "ohmic contact" may refer to a non-rectifying contact that has a contact resistance of less than about 1 Ω-mm. The presence of the protective layer 24 during the high temperature process steps may reduce and/or inhibit damage to the barrier layer 22 and the source/drain regions 34 that may be caused by such steps. Thus, for example, the sheet resistance of the gate region (i.e., the length of the channel between the source/drain regions 34) after the high temperature ohmic contact anneal may be substantially the same as the sheet resistance of the gate region as-grown (i.e., before the contact anneal).

The source/drain ohmic contacts 40 may be spaced apart from the protective layer 24 by a distance that is sufficient to allow for misalignment tolerances in the formation and/or patterning of the ohmic contact metal. For example, the edges of the source/drain ohmic contacts 40 may be spaced apart from the protective layer 24 by a distance of about 0.1 micrometer (μm) to about 0.2 μm. It may be desirable to prevent contact between the ohmic metal and the protective layer 24 to reduce the likelihood of the metal diffusing into the protective layer 24 during subsequent heating steps, which may result in a short between a gate contact and the source/drain ohmic contacts 40. However, the gaps between the source/drain ohmic contacts 40 and the protective layer 24 need not be so large as to defeat the protective purpose of the protective layer 24 (and/or substantially degrade the performance of the device), but may not be so small as to risk contact between the ohmic material and the protective layer 24. Thus, in certain embodiments of the present invention, the gaps may be in the range of about 0.1 micrometer (μm) to about 0.5 μm.

It will be appreciated that, in some embodiments, it may not be necessary to anneal the deposited metal in order to form the source/drain ohmic contacts 40. For example, where the source/drain ohmic contacts 40 are formed on implanted source/drain regions 34 in the barrier layer 22, the metal may be ohmic as-deposited. Since a contact anneal may not be required, it may be acceptable for the metal of the source/drain ohmic contacts 40 to contact the protective layer 24. Thus, in some embodiments of the invention, a lithography step that may otherwise be required to ensure that the source/drain ohmic contacts 40 are spaced away from the protective layers 24, 36 may be avoided as a result of the implantation of impurities into the barrier layer 22. In addition, since the source/drain ohmic contacts 40 may be formed on the implanted regions, the ohmic contacts may have a lower resistivity than ohmic contacts formed on non-implanted regions. Thus, the on-resistance of devices formed according to some embodiments of the invention may be lowered. Moreover, some embodiments of the present invention may employ semiconductor fabrication methods as discussed in currently commonly assigned U.S. patent application Ser. No. 11/302,062 entitled SEMICONDUCTOR DEVICES INCLUDING IMPLANTED REGIONS AND PROTECTIVE LAYERS AND METHODS OF FORMING THE SAME, and U.S. application Ser. No. 11/434,853 entitled SEMICONDUCTOR DEVICES INCLUDING SELF ALIGNED REFRACTORY CONTACTS AND METHODS OF FABRICATING THE SAME, the disclosures of which are incorporated by reference herein in their entireties.

Figure 1I:
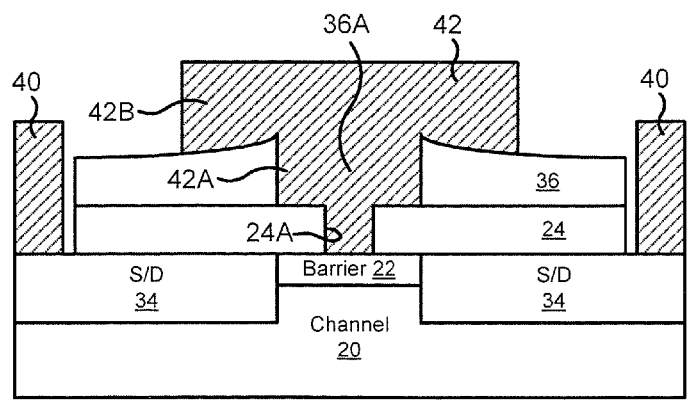

Referring to FIG. 1I, a gate contact 42 is formed in the via hole 24A and the opening 36A. The gate contact 42 may have a T-shape, with wings extending onto upper surfaces of both the first protective layer 24 and the second protective layer 36. The gate contact 42 may be deposited by evaporation/sputtering and liftoff. In particular, the gate electrode 42 extends through the protective layer 24 to contact the exposed portion of the barrier layer 22. The gate electrode 32 may be formed in the via hole 24A directly on opposing sidewalls of the protective layer 24, such that a gap may not be formed between the two. Suitable gate materials may depend on the composition of the barrier layer 24. However, in certain embodiments, conventional materials capable of making a gate contact to a nitride based semiconductor material may be used, such as Ni, Pt, NiSi, Cu, Pd, Cr, TaN, W and/or WSiN.

Still referring to FIG. 1I, first portions 42A (also referred to as "wings" or "sidelobes") of the gate electrode 42 laterally extend on surface portions of the protective layer 24 outside the via hole 24A, and second portions 42B of the gate electrode 42 that are spaced vertically apart from the first protective layer 24 laterally extend on surface portions of the second protective layer 31 outside the opening 36A. The second portions 42B of the gate electrode 42 may extend laterally beyond the first portions 42A. Because the via hole 24A and the opening 36A may be self-aligned by the processes described thus far, the length by which the first portions 42A of the gate electrode 42 extend onto the protective layer 24 may be controlled. As such, according to some embodiments of the present invention, gate-to-drain capacitance (cgd) and/or gate-to-source capacitance (cgs) of the transistor device that may be caused by the extension of the gate electrode 42 onto the protective layer 24 may also be controlled. Accordingly, a gate 42 having self-aligned sidelobes 42A may be formed.

It will be appreciated that the gate length is defined by the size of the via hole 24A in the protective layer 24, rather than by the lithographic processing used to define the metal contact.

Figure 2A:
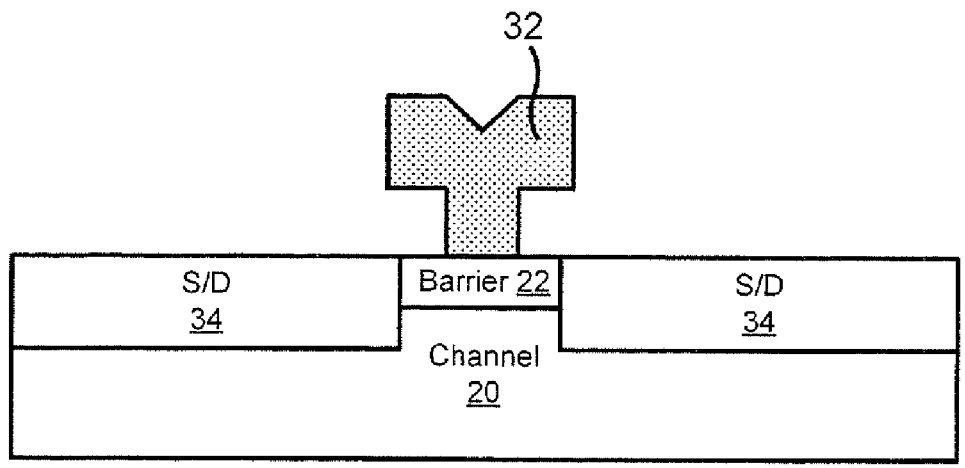
FIGS. 2A to 2B are cross-sectional views illustrating intermediate fabrication steps in operations for fabricating transistor devices according to further embodiments of the present invention.
Figure 2B:
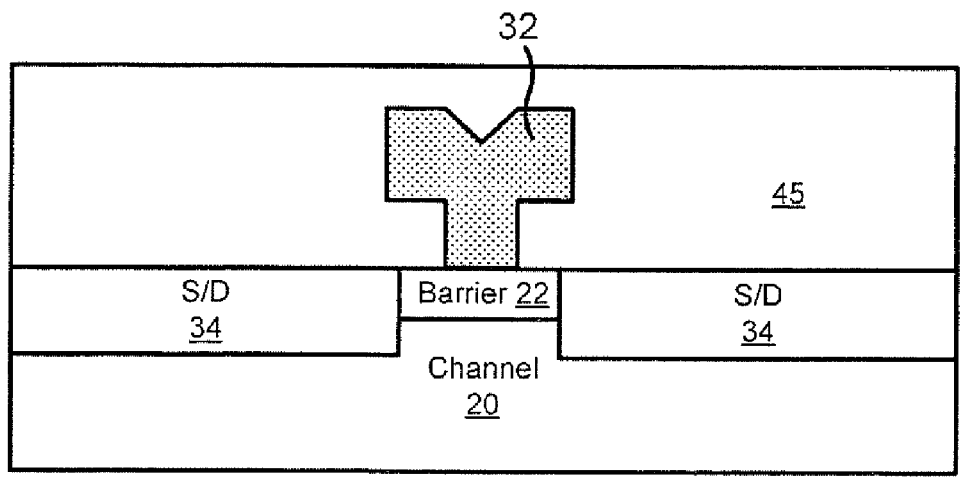

FIGS. 2A and 2B illustrate embodiments in which the protective layer 24 is removed after implantation and annealing of the source/drain regions 34. In some cases, it may be desirable to remove the protective layer 24 after annealing the source/drain regions, as the activation anneal may degrade the quality of the protective layer 24, and in particular the quality of the interface between the protective layer 24 and the barrier layer 22. Referring to FIG. 2A, after implantation and annealing of the source/drain regions 34, the protective layer 24 may be removed, for example by wet etching. If the protective layer 24 includes SiN, the protective layer 24 may be removed by wet etching using concentrated HF and/or heated phosphoric acid ($H_3PO_4$) as an etchant. If the protective layer 24 is an oxide, it may be removed by wet etching using a buffered oxide etchant (BOE) or buffered hydrofluoric acid as an etchant.

After removal of the protective layer 24, a new protective layer 45 can be applied to the structure. The new protective layer 45 may include SiN, and may be deposited, for example by sputtering and/or low pressure chemical vapor deposition (LPCVD), in a manner that fills in gaps beneath the masking gate 32. Processing the device may then continue as described above with the new protective layer 45 in place.

Figure 3A:
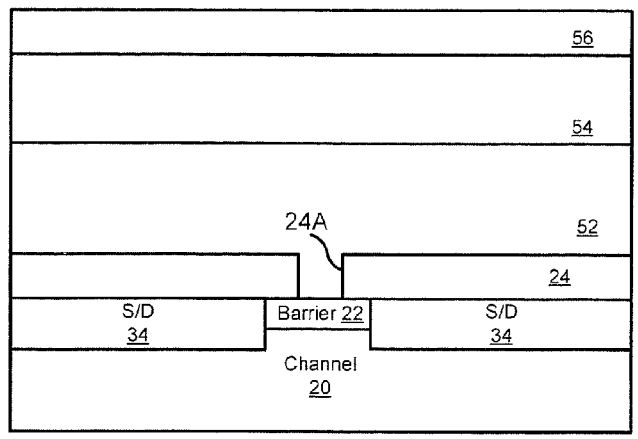
FIGS. 3A to 3C are cross-sectional views illustrating intermediate fabrication steps in operations for fabricating transistor devices according to further embodiments of the present invention.
Figure 3B:
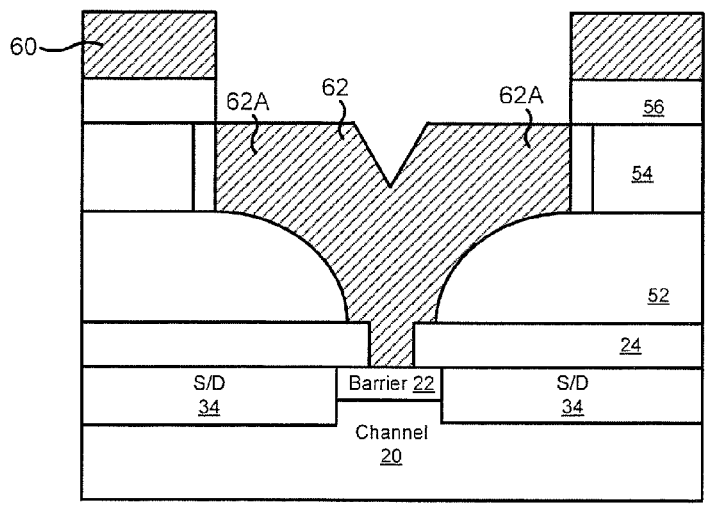
Figure 3C:
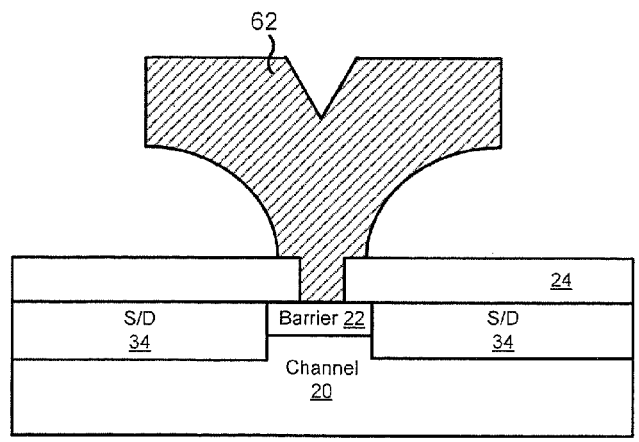

FIGS. 3A to 3C illustrate alternative techniques for forming the gate structure on the device. In particular, the operations illustrated in FIGS. 3A to 3C may be performed after implantation and annealing of the source/drain regions 34, described above in connection with FIG. 1F. Referring to FIGS. 1F and 3A, after implantation and annealing of the source/drain regions 34, the mask 25 may be removed, for example by means of a photoresist strip and/or an etch process. Furthermore, the masking gate 32 may be removed as described above. In particular, the masking gate 32 may be removed by wet etching with an etchant that preferentially etches the material of the masking gate 32 relative to the material of the protective layer 24 and the barrier layer 22. When the masking gate 32 includes sputtered AlN, the protective layer 24 includes SiN and the barrier layer 22 includes AlGaN, the masking gate 32 can be removed by etching with an undiluted TMAH-based developer.

After removal of the masking gate 32, a three-layer resist stack including a first resist layer 52, a second resist layer 54 and a third resist layer 56 are formed on the protective layer 24. The third resist layer 56 may be thin relative to the first and second resist layers 52, 54. In particular, the first resist layer 52 may have a thickness of about 400 nm, the second resist layer 54 may have a thickness of about 500 nm, and the third resist layer 56 may have a thickness of about 300 nm.

The first, second and third resist layers may include e-beam sensitive resists. In particular, the first resist layer 52 and the third resist layer 53 may include PMMA, while the second resist layer 54 may include co-polymer of PMMA and PMAA. A single e-beam exposure is used to expose the resist layers. An opening in the second resist layer 54 may be wider than openings in the first and third resist layers 52, 56, due to differential sensitivity of the resist layers. An opening in the third resist layer 56 is widened, for example by ashing, and an opening in the first resist layer 52 is formed to have a slanted or tapered profile in the ashing process.

When the first resist layer 52 is developed, the resist material is removed from the via hole 24A in the protective layer 24.

A metal layer 60 is then formed on the structure, for example by sputtering, to form a metal gate contact 62. The metal gate contact 62 extends through the first resist layer 52 and into the via hole 24A in the protective layer 24. The metal gate contact 62 further includes wings 62A that extend onto portions of the first resist layer 52.

Referring to FIG. 3C, the first, second and third resist layers 52, 54, 56 can be removed, leaving an air-T metal gate contact 62. It will be appreciated that the gate length is defined by the size of the via hole 24A in the protective layer, rather than by the lithographic processing used to define the metal contact.

In some embodiments, gate structures can be formed as described in co-pending and commonly assigned U.S. application Ser. No. 11/493,069 entitled "METHODS OF FABRICATING TRANSISTORS INCLUDING DIELECTRICALLY-SUPPORTED GATE ELECTRODES AND RELATED DEVICES," and co-pending and commonly assigned U.S. application Ser. No. 11/333,726 entitled "METHODS OF FABRICATING TRANSISTORS INCLUDING SUPPORTED GATE ELECTRODES AND RELATED DEVICES," the disclosures of which are incorporated by reference herein in their entireties.

Figure 4:
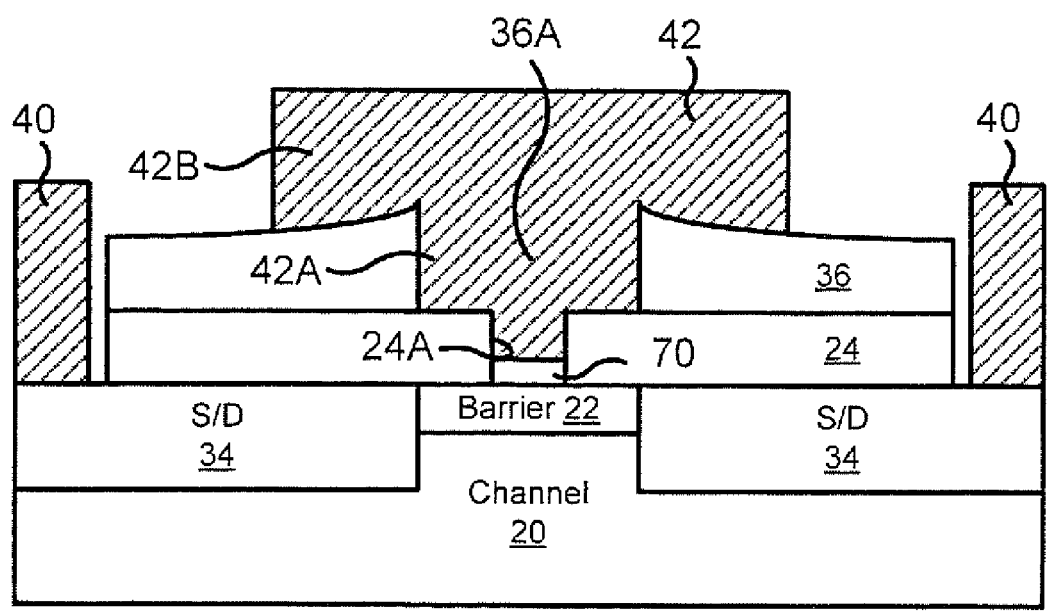
FIG. 4 is a cross-sectional view illustrating a transistor device according to some embodiments of the present invention.

Referring to FIG. 4, some embodiments may include forming a gate dielectric 70 on the barrier layer 22 within the via hole 24A before forming the gate contact 42. Accordingly, some embodiments can be used to form a metal insulator semiconductor device (i.e., a MISHEMT or MISHFET device). The gate dielectric 70 can be formed as described in copending and commonly assigned U.S. application Ser. No. 11/799,786 entitled "INSULATING GATE ALGAN/GAN HEMTS," filed May 3, 2007, the disclosure of which is incorporated by reference herein in its entirety.

Figure 5A:
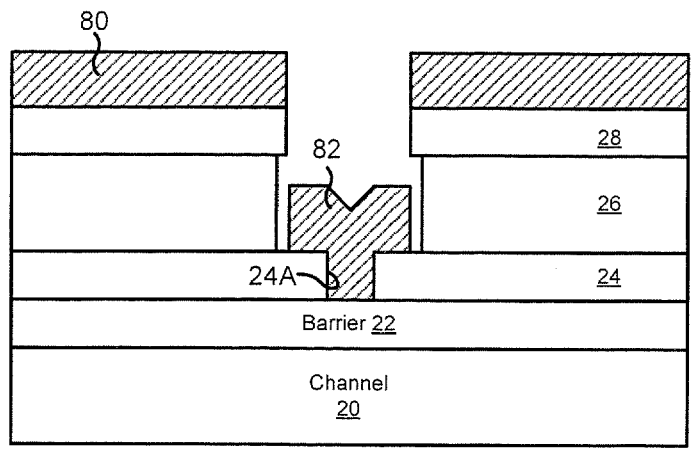
FIGS. 5A to 5C are cross-sectional views illustrating intermediate fabrication steps in operations for fabricating transistor devices according to further embodiments of the present invention.
Figure 5B:
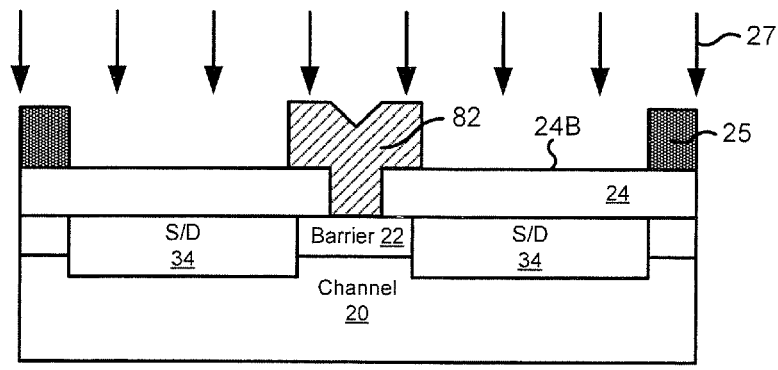
Figure 5C:
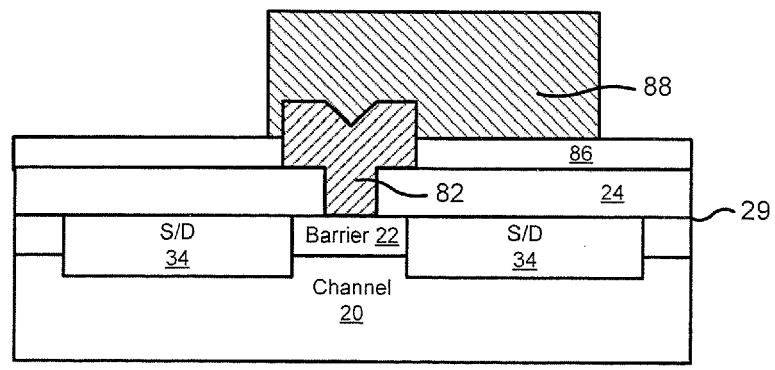

FIGS. 5A-5C illustrate intermediate operations for forming a transistor device in which the masking gate is not removed, but remains on the device as an operational gate. Referring to FIG. 5A, after the protective layer 24 and the first and second resist layers 26, 28 have been patterned to form the via hole 24A and the first and second apertures 26A, 26B (as illustrated in FIGS. 1A-1C), a layer 80 of conductive material may be deposited on the structure, for example by sputtering or evaporation. The deposited material 80 forms a gate contact 82 that extends through the via hole 24A to contact the barrier layer 22. The conductive material 80 may include a metal that does not form an ohmic contact with the barrier layer 22, even after annealing at a high temperature, e.g., in excess of 1000° C. For example, the conductive material 80 may include TiW, TiWN, or another refractory metal. In some embodiments, the conductive material 80 may include a metal silicide, such as WSiN, Re, and/or TaN.

Referring to FIG. 5B, the resist layers 26, 28 are removed, and an implant mask 25 is formed on the structure. Dopants are implanted into the barrier and channel layers 22, 20 to form source/drain regions 34 therein using the gate contact 82 as an implant mask. The source/drain regions 34 are then annealed to activate the implanted dopants, as described above.

Referring to FIG. 5C, a second protective layer 86 may be formed on the structure, and may be etched back or planarized to expose the gate contact 82. The second protective layer 86 may include SiN, SiO$_2$, polyimide or another electrically insulating material. In some embodiments, the protective layer 24 may be removed before forming the second protective layer 86. Finally, a conductive overlayer 88 can be formed to contact the gate contact 82 using conventional lithographic techniques. As shown in FIG. 5C, the overlayer 88 can be offset relative to the gate contact 82. In some embodiments, an air-T structure can be formed on the gate contact as illustrated in FIGS. 3A-3C.

While embodiments of the present invention have been described herein with reference to particular HEMT structures, the present invention should not be construed as limited to such structures, and may be applied to formation of gate electrodes in many different transistor structures, such as pseudomorphic HEMTs (pHEMTs) (including GaAs/AlGaAs pHEMTs) and/or GaN MESFETs. More generally, embodiments of the present invention may be applied in any electronic device where a gate electrode may be formed and/or where preservation of the as-grown surface properties may be imperative. For example, silicon nitride and/or other removable encapsulant can be used in the fabrication sequence of AlGaN metal-semiconductor-metal (MSM) detectors, RF limiter diode structures, and/or power switching Schottky diodes.

Also, additional layers may be included in transistor devices while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated by reference as if set forth fully herein. In some embodiments, insulating layers such as SiN$_x$, or relatively high quality AlN may be deposited for making a MISHEMT and/or passivating the surface. The additional layers may also include a compositionally graded transition layer or layers. In addition, the barrier layer 22 described above may also include multiple layers. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering.

In the drawings and specification, there have been disclosed typical embodiments of the invention, and, although specific terms have been employed, they have been used in a generic and descriptive sense only and not for purposes of limitation.

That which is claimed:

1. A method of forming Group III-nitride transistor device, comprising:
    forming a protective layer on a Group III-nitride semiconductor layer;
    forming a via hole through the protective layer to expose a portion of the Group III-nitride semiconductor layer;
    forming a masking gate on the protective layer, the masking gate including an upper portion having a width that is larger than a width of the via hole and having a lower portion extending into the via hole;
    implanting source/drain regions in the Group III-nitride semiconductor layer using the masking gate as an implant mask;
    removing the masking gate; and
    forming a gate contact in the via hole.

2. The method of claim 1, wherein the protective layer comprises a first protective layer, the method further comprising:
    forming a second protective layer on the first protective layer and on the masking gate after implanting the source/drain regions; and
    etching the second protective layer to expose the masking gate, wherein removing the masking gate comprises removing the masking gate after etching the second protective layer, and forming an aperture in the second protective layer.

3. The method of claim 2, further comprising depositing a conductive material in the via hole and in the aperture in the second protective layer after removing the masking gate; and
    patterning the conductive material to form a gate contact;
    wherein a portion of the gate contact extends laterally across the protective layer.

4. The method of claim 3, wherein a second portion of the gate contact extends laterally across the second protective layer beyond the aperture in the second protective layer.

5. The method of claim 1, further comprising forming a metal overlayer on the gate contact.

6. The method of claim 1, wherein the lateral distance from the outer edge of the masking gate to the edge of the via hole is about 100 nm to about 300 nm.

7. The method of claim 1, wherein the via hole has a width of about 100 nm.

8. The method of claim 1, wherein the masking gate comprises a refractory metal, aluminum nitride, polysilicon and/or a metal silicide.

9. The method of claim 1, wherein the protective layer comprises silicon nitride.

10. The method of claim 1, wherein a lateral distance from an outer edge of the upper portion of the masking gate to an edge of the via hole is less than about 300 nm.

11. A method of forming Group III-nitride transistor device, comprising:
    forming a protective layer on a Group III-nitride semiconductor layer;
    forming a via hole through the protective layer to expose a portion of the Group III-nitride semiconductor layer;
    forming a masking gate on the protective layer, the masking gate including an upper portion having a width that is larger than a width of the via hole and having a lower portion extending into the via hole; and
    implanting source/drain regions in the Group III-nitride semiconductor layer using the masking gate as an implant mask;
    wherein forming the masking gate comprises:
    forming a first resist layer on the protective layer;
    forming a second resist layer on the first resist layer, wherein the first resist layer is between the second resist layer and the protective layer; and
    patterning the first resist layer and the second resist layer to respectively form a first aperture in the first resist layer and a second aperture in the second resist layer, wherein the first aperture is between the second aperture and the protective layer and wherein the first aperture has a greater width than the second aperture;
    wherein forming the via hole comprises etching the protective layer using the second resist layer as an etch mask.

12. The method of claim 11, wherein forming the masking gate comprises depositing a masking material in the first aperture and the via hole, the masking material having an etch selectivity relative to the protective layer and the Group III-nitride layer.

13. The method of claim 12, wherein depositing a masking material in the first aperture and the via hole comprises depositing aluminum nitride in the first aperture and the via hole.

14. The method of claim 1, wherein the first resist and the second resist comprise e-beam resists having different developer sensitivities, and wherein patterning the first resist layer and the second resist layer comprise exposing the first resist layer and the second resist layer to an e-beam and developing the first resist layer and the second resist layer using different developers.

15. The method of claim 11, further comprising:
    expanding the width of the second aperture before forming the masking gate, wherein the width of the masking gate is defined by the expanded width of the second aperture.

16. The method of claim 15, wherein expanding the width of the second aperture comprises ashing the second resist layer.

17. A method of forming Group III-nitride transistor device, comprising:
    forming a protective layer on a Group III-nitride semiconductor layer;
    forming a via hole through the protective layer to expose a portion of the Group III-nitride semiconductor layer;
    forming a masking gate on the protective layer, the masking gate including an upper portion having a width that is larger than a width of the via hole and having a lower portion extending into the via hole;

implanting source/drain regions in the Group III-nitride semiconductor layer using the masking gate as an implant mask; and annealing the implanted source/drain regions with the masking gate intact, wherein the masking gate is removed after annealing the implanted source/drain regions.

18. The method of claim 17, further comprising:

removing the protective layer after annealing the source/drain regions and before removing the masking gate; and forming a second protective layer on the Group III-nitride layer and the masking gate before removing the masking gate.

* * * * *

UNITED STATES PATENT AND TRADEMARK OFFICE
CERTIFICATE OF CORRECTION

PATENT NO. : 8,105,889 B2
APPLICATION NO. : 12/509855
DATED : January 31, 2012
INVENTOR(S) : Smith et al.

Page 1 of 1

It is certified that error appears in the above-identified patent and that said Letters Patent is hereby corrected as shown below:

In the Patent:
Column 14, Line 19: Please correct "Ni, Pt, NiSi, Cu" to read -- Ni, Pt, $NiSi_x$, Cu --

In the Claims:
Column 18, Claim 14 Line 42: Please correct "of claim 1" to read -- of claim 9 --

Signed and Sealed this
Twenty-second Day of May, 2012

David J. Kappos
*Director of the United States Patent and Trademark Office*